United States Patent
Kumar

(10) Patent No.: US 6,438,048 B1
(45) Date of Patent: Aug. 20, 2002

(54) NONVOLATILE MEMORY AND HIGH SPEED MEMORY TEST METHOD

(75) Inventor: Promod Kumar, Ghaziabad (IN)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/670,248

(22) Filed: Sep. 26, 2000

(30) Foreign Application Priority Data

Sep. 30, 1999 (EP) .............................................. 99830616

(51) Int. Cl.$^7$ .............................................. G11C 29/00
(52) U.S. Cl. .................... 365/201; 365/185.09; 714/42; 714/732
(58) Field of Search ........................... 365/201, 185.33, 365/185.09; 714/30, 42, 718, 719, 732

(56) References Cited

U.S. PATENT DOCUMENTS

| | | | |
|---|---|---|---|
| 5,535,164 A | * 7/1996 | Adams et al. | 365/201 |
| 5,631,913 A | 5/1997 | Maeda | 371/22.4 |
| 5,640,509 A | * 6/1997 | Balmer et al. | 365/201 |
| 5,754,567 A | * 5/1998 | Norman | 365/185.09 |
| 5,872,794 A | 2/1999 | Cook et al. | 371/22.4 |

FOREIGN PATENT DOCUMENTS

EP   0 817 057 A2   1/1998

OTHER PUBLICATIONS

Lewin, Douglas, and Protheroe, David, "Digital Circuit Testing and Design for Testability,"*Design of Logic Systems, Second Edition*, Chapman & Hall, 10.1 pp. 442–445.

* cited by examiner

Primary Examiner—Son Mai
(74) Attorney, Agent, or Firm—Lisa K. Jorgenson; Brian L. Johnson; Seed IP Law Group, PLLC

(57) ABSTRACT

A nonvolatile memory device has a signature code generator generating an new signature code as a function of data read from the cell array and the previously calculated signature code. Data are read in sequence, using an internal clock generated by an internal clock oscillator. In test mode, the memory is scanned sequentially, beginning from any memory location, selected randomly, and the signature code is variable in dynamic way; at the end of memory scanning, the signature code is compared to an expected result. Thus, testing may be performed at Wafer Sort Test Level, reading the memory cells at the memory operative speed, so as to ensure an early, fast and thorough detection of faults.

27 Claims, 6 Drawing Sheets

NONVOLATILE MEMORY AND HIGH SPEED MEMORY TEST METHOD

TECHNICAL FIELD

The present invention relates to a nonvolatile memory and a high speed memory test method. In particular, the invention relates to flash memories and testing thereof.

BACKGROUND OF THE INVENTION

As known, memory test methods are intended to cover and screen various types of possible defects present in memories, so as to ensure reliability of the end product. Memory tests are carried out at different manufacturing stages of the memory using special equipments, exploiting special internally implemented test modes. Memory tests are typically performed, e.g., at Wafer Sort Level, Final Test Level and Final Device Characterization Level.

Specifically, the Wafer Sort Level test is carried out by connecting one or more memories belonging to a same wafer to a test machine which generates the addresses and timing clocks fed to each tested memory in the wafer; then a test pattern is written in each tested memory; data are read from each memory and furnished to the test machine to be compared with expected readings, to detect any fault.

The wafer sort level testers are limited in the array scanning speed; in particular, most of the memory testers provide the facility of multiple strobes in a same cycle time (synchronous mode testing, e.g., burst mode testing), which allows to perform data check reading of more than one address location in a same cycle time. Indeed, presently burst mode testing works on the principle of outputting the data read from the matrix in a pipeline way. The matrix array is divided into two independent halves called even and odd matrices, each having a respective set of 16 sense amplifiers for reading. During the device testing, reading is commanded by the tester, which furnishes the beginning address for starting the burst, and a clock RD for synchronization. Then, the memory generates consecutive addresses synchronized with read requests fed to the device through the clock RD. The addresses are decoded separately for the two matrix parts and reading is controlled by even/odd priority signals generated by a timing control logic in the memory. The addresses are linearly incremented in synchronization with the external clock RD and sequence reading is continued until the tester initiates a new burst sequence by latching a new address into the memory through a pin ALE provided for the purpose.

To test the correct device functionality and screen any possible sensing marginalities, a large number of tests are performed at various stages of Wafer Sort Flow, each needing to scan the whole matrix at least once. Therefore the test time during production is huge. Furthermore the minimum obtainable cycle time at Wafer Sort Level is limited, in the best case, to 100 ns, which is much larger than the access time specification of present flash memories. Thus, testing cannot be made at the memory operative speed. On the other hand, some defects may be detected only at high speed cycling, because otherwise the possible noise conditions do not intervene or get unnoticed.

To reduce the test time, the read data are often compressed internally to the device and the compression result, defining a code and also called "signature", is fed to the test machine and compared to an expected result. Thus, the tester does not need to receive all read data, but only a final code (the signature) that is uniquely evaluated as a function of the read data and the sequence in which it occurs; thereby the signatures obtained after a partial or a complete matrix scan flag the possible errors occurred during scanning.

According to a widespread solution, used in particular for ROMs and called checksum method, the memory array is internally read in a random manner using LFSRs (Linear Feedback Shift Registers) for generating random addresses; at each scan, the read data are summed in a binary way to the previous result; so, if a ROM to be checked consists of $2^N$ data words and each data word contains B bits, the checksum is formed by the modulo-$2^k$ arithmetic sum of the $2^N$ data words in the ROM, where k is arbitrary. This means that all words in ROM are added together and k least significant terms of the sum form the signature or checksum. The result (signature) is fed at preset intervals or at the end of matrix scan to the tester to be compared for finding any failures.

Another popular solution particularly used for SRAM/DRAMs uses the LFSRs to generate random addresses and data pattern. The internal verification consists of two steps for every randomly addressed location. In the first step, the random data is written at the random address generated. The second step confirms the data back by reading. In some other approaches the data read are compressed in a response analyzer. The compression algorithm is fixed for the entire duration of the matrix scan. Thereby, at any time, the signature Q(t) present in the compressor unit may be mathematically expressed by:

$$Q(t)=f(\text{data}, Q(t-1)) \quad (1)$$

wherein data is the just read data and Q(t−1) is the previous signature code.

A block diagram of a known memory device showing known elements as regards testing is shown in FIG. 1. The memory device 1 comprises an address counter 2 receiving from the tester an initial address A0 and a synchronization signal RD and generating a sequence of reading addresses A; a matrix 3 receiving from the address counter 2 each time an address A of the cell to be read; an XOR/ADDER block 4, receiving from the matrix 3 the read data D and generating the signature Q; a master/slave unit 5, storing the signature Q and having an output 6 for connection to the tester. A feedback control block 7 generates the feedback polynomial value FBP used by the XOR/ADDER block 4 to generate the signature Q according to the expression (1); to this end, the feedback control block 7 receives the signature Q. The signature Q is also fed to the XOR/ADDER block 4. XOR/ADDER block 4, master/slave unit 5 and feedback control block 7 form a signature generator 8. The clock RD, fed from the tester, is also used for synchronizing the XOR/ADDER block 4 and the master/slave unit 5.

The above described compression solution does not always ensure error detection; indeed, the possibility of obtaining the same signature from two different patterns is low but cannot be ruled out.

Later tests, carried out at Final Test Level or Final Device Characterization Level use high speed machines capable of detecting fault conditions not discovered at Wafer Sort Level. However, also the test machines used at final test level prove to be insufficient to truly satisfy the fast speed test requirements, so that complete memory test cannot be performed in production testing. Furthermore, any defective memories detected at those late stages cause higher costs for rejected devices.

The aim of the present invention is therefore to allow high speed memory testing at Wafer Sort Level.

SUMMARY OF THE INVENTION

According to the present invention, there is provided a nonvolatile memory and a high speed memory test circuit and method, having an internal clock that controls the memory array to read from a plurality of memory cells in a rapid fashion.

BRIEF DESCRIPTION OF THE DRAWINGS

For a better understanding of the present invention, a preferred embodiment is now described, purely by way of non-limiting example, with reference to the attached drawings.

DETAILED DESCRIPTION OF THE INVENTION

Figure 1:
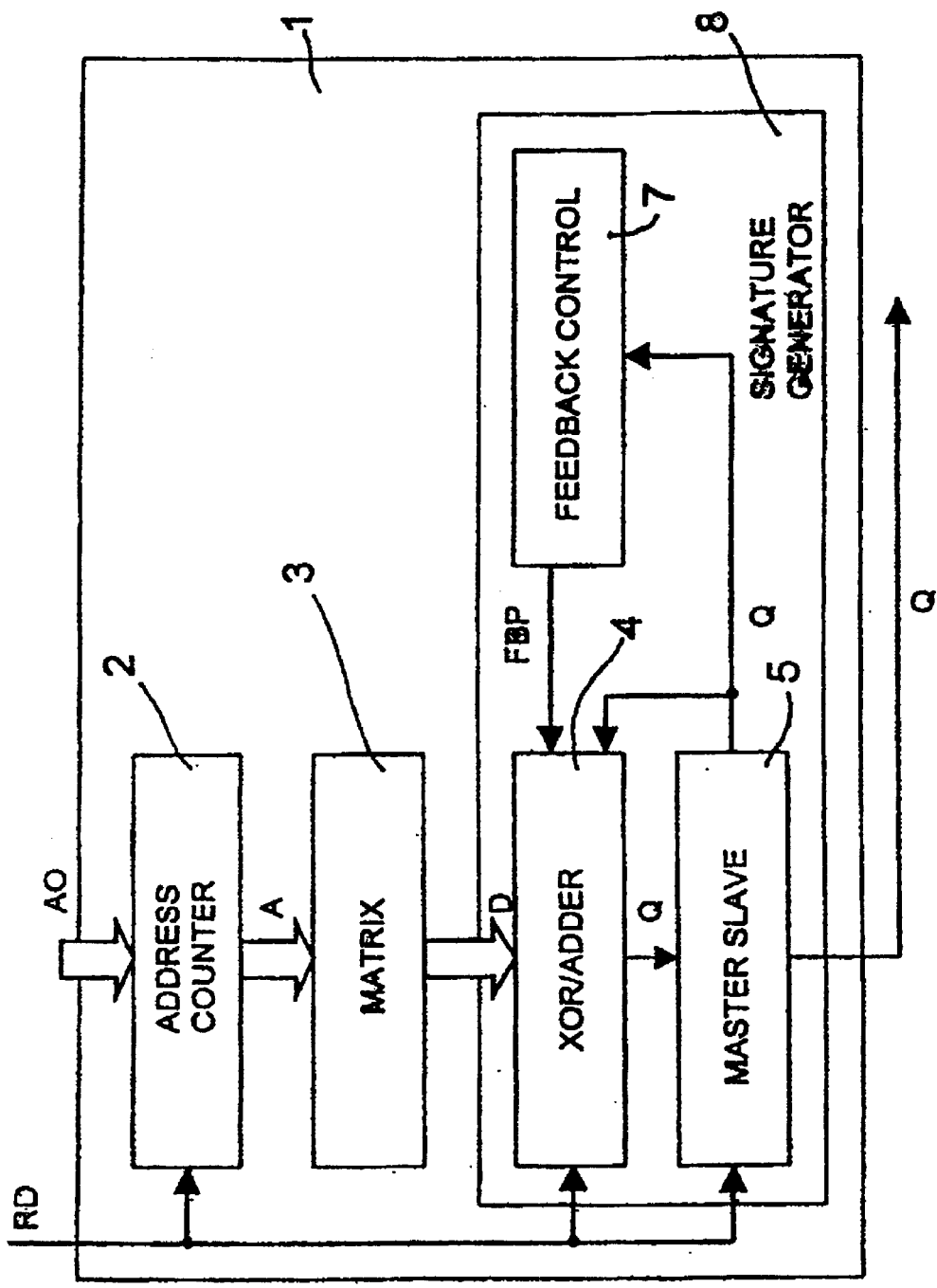
FIG. 1 is a block diagram of a known memory device, showing only the parts involved during testing.
Figure 2:
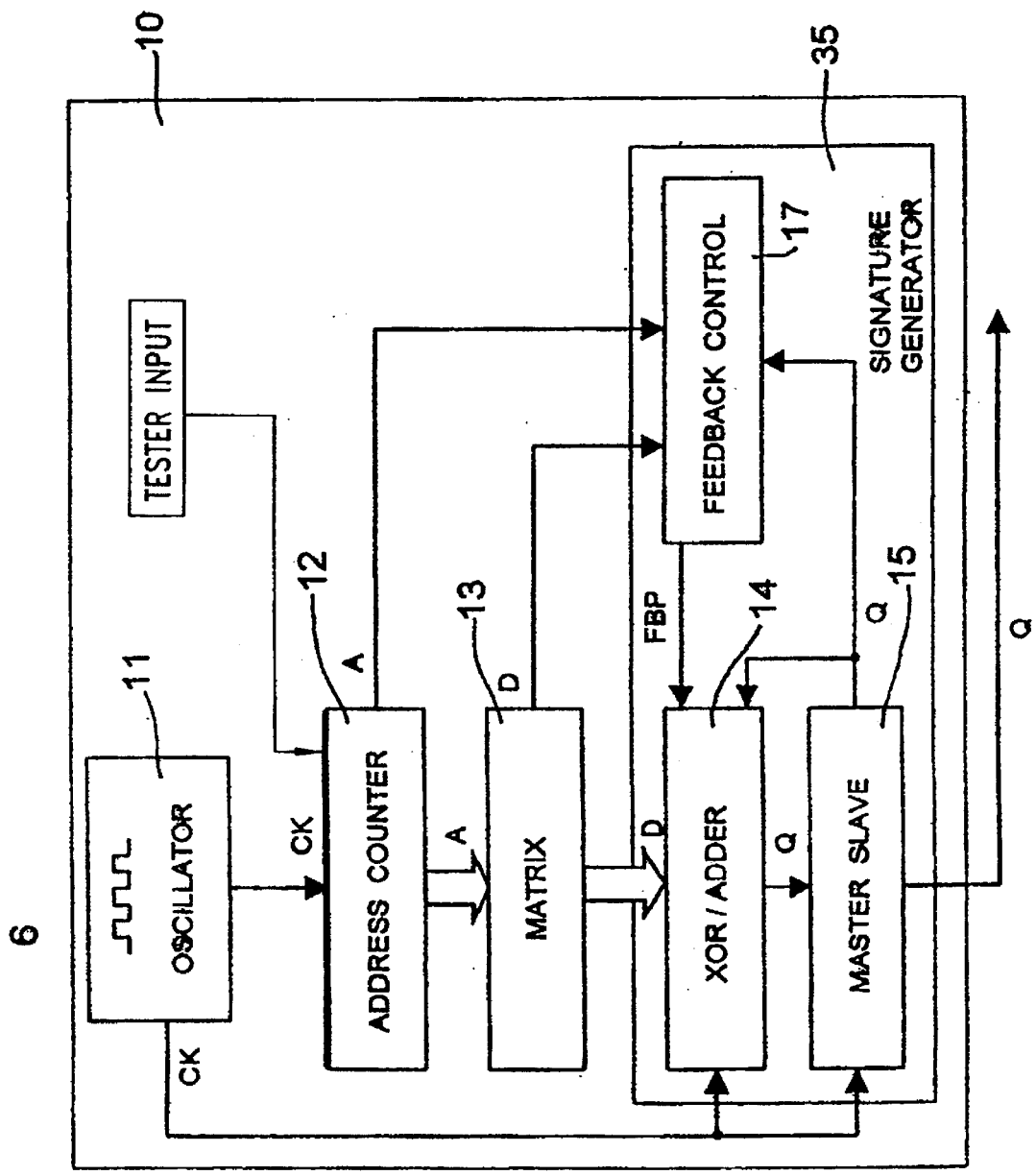
FIG. 2 is a block diagram of the memory device according to the present invention, showing only the parts involved during testing.

A memory device 10 according to the invention has the architecture shown in FIG. 2. As shown, the memory device 10 has a built-in oscillator 11 generating a clock CK fed to an address counter 12 connected to a matrix 13. The read data D is furnished to a XOR/ADDER block 14 also receiving a feedback polynomial value FBP and a signature Q; the signature Q is fed to a master/slave unit 15, analogously to FIG. 1. In FIG. 2, the address counter 12 is also connected to the feedback control block 17 and feeds thereto the address D (or a preset combination/part thereof) for dynamically changing the feedback polynomial during matrix scan, as discussed in detail hereinbelow. XOR/ADDER block 14, master/slave unit 15 and feedback control block 17 form a signature generator 35.

During testing, when so enabled by a tester, the address counter 12 generates a consecutive sequence of cell addresses to allow a consecutive scanning of a substantial part of the matrix, wherein "substantial" here indicates a number of cells greater than 4, for example an entire sector, if the matrix is divided in sectors, or a matrix half, if the matrix is divided in two parts. Preferably, testing comprises uninterrupted scanning of the entire matrix, so as to reduce the overall testing time.

Thereby, the total matrix scan time is reduced by a factor of 5–10, depending upon the memory speed. The matrix can be tested at high frequency at Wafer Sort Level, starting from any address, in working-like conditions. Thus, testing is more thorough than presently done and defective memories may be detected at an earlier stage.

Furthermore, the compression algorithm is changed dynamically using the address of the presently selected cell or a signal derived therefrom. Therefore, the compression is no more fixed, but is a function of a predefined variable parameter and the signature may be mathematically expressed by:

$$Q(t)=f(\text{address, data, } Q(t-1)) \quad (2)$$

Since the address changes for each memory location, the compression algorithm continuously changes its characteristics reducing the risk of possible error masking.

Figure 3:
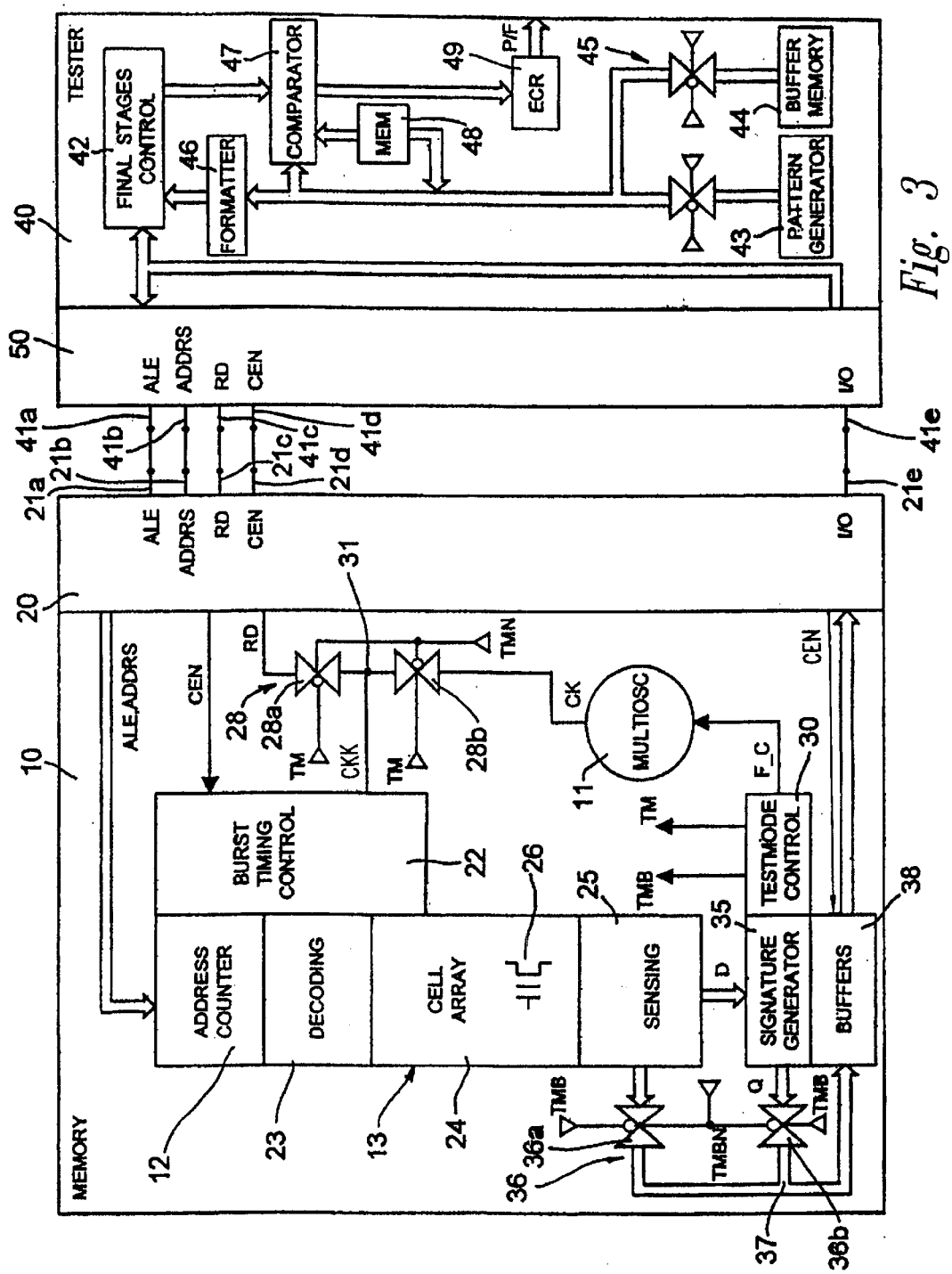
FIG. 3 is a block diagram of the memory device architecture according to the present invention as connected to a tester.

A more detailed architecture of the memory device 10 according to one embodiment of the invention and its connection to a tester are shown in the diagram of FIG. 3. The memory device 10 has an interface 20 connected to input pins 21a–21d including a pin 21a for an address latch enable signal ALE, pins 21b for the addresses ADDRS, a pin 21c for an external clock RD and a pin 21d for a chip enable signal CEN, and pins 21e for input/output data I/O. Signals ALE, ADDRS are fed to the address counter 12; signal CEN (for chip deselection) is fed to all input/output buffers and to a burst timing control block 22 for generating, as described hereinbelow with reference to FIG. 4, timing signals for the memory device 10; and the external clock RD is fed to a clock multiplexer 28. The multiplexer 28 is formed by two clock pass gates 28a and 28b receiving a test mode signal TM and an inverted test mode signal TMN generated by a test mode control unit 30 so as to be alternately conductive. The signal input of the clock pass gate 28a receives the external clock RD; the signal input of the clock pass gate 28b receives the internal clock CK generated by the oscillator 11; the signal outputs of the clock pass gates 28a and 28b are connected to a common clock node 31 connected to the burst timing control block 22; thus the burst timing control block 22 receives a timing clock CKK selectively fed by the external clock pin 21c or the oscillator 11, according to the value of the test mode signals TM, TMN. Preferably, oscillator 11 is a multifrequency one, and is controlled by the test mode control unit 30 through a frequency control signal F_C as discussed hereinbelow.

Matrix 13 is shown split in three parts: a decoding stage 23, connected to the address counter 12 to receive the addresses of the cell to be read; a cell array 24, formed by nonvolatile cells 26 to be read (only one shown); and a sensing stage 25, connected to the array 24 and outputting the read data. Structure and connection of these three parts are well known in the art and thus not shown in detail.

The sensing stage 25 is connected at its output both to signature generator 35 and to a data multiplexer 36. Data multiplexer 36 is formed by two data pass gates 36a and 36b receiving a signature output signal TMB (and the inverted one TMBN) generated by the test mode control unit 30 so as to be alternately conductive. Data pass gate 36a is connected between the sensing stage 25 and a common output data node 37; data pass gate 36b is connected between the signature generator 35 and the common output data node 37. Common data output node 37 is connected to a buffer stage 38 in turn connected to the interface 20 to supply the input/output data I/O. The test mode control unit 30 selects one of pass gates 36a or 36b for presenting either the sensed data outputted by the sensing stage 25 or the signature outputted by signature generator 35. The common output data node 37 which is connected to output buffers 38 and thus to the I/O pins 21e for interfacing with tester 40 can present either a signature generated by signature generator 35 or successive data sensed in sensing stage 25 of memory device 10. The sensed data can be used along with the multistrobe feature of tester 40 to perform fast speed testing. The signature can be used for testing the memory device 10 with testers that do not have the multistrobe facility.

In FIG. 3, the memory device 10 is connected to a tester 40 of known type, comprising pins 41a, 41b, 41c, 41d and 41e connected to the pins 21a–21e of the memory device 10 for exchanging corresponding signals/addresses/data ALE, ADDRS, RD, CEN and I/O; a final stage control block 42 connected to the pins 41a–41e through an interface 50; a pattern generator 43; a buffer memory 44; a pattern multiplexer 45 for alternately connecting the pattern generator 43 and the buffer memory 44 to a formatter 46; and a comparator 47 having inputs connected to the final stage control block 42, to the output of the pattern multiplexer 45 and to a program memory block 48 and an output connected to an error cache memory 49.

In order to perform testing of the memory device 10 according to FIG. 3, the program memory block 48 stores both the test pattern information and the expected signature (s). Alternatively, a tester software module interacting with tester hardware may algorithmically generate the test pattern and the expected signature(s). The tester 40 includes a multistrobe feature in one embodiment, or does not include a multistrobe feature in another; the present invention may be used with either embodiment. At the beginning, program memory block 48 sends the addresses related to the test pattern to the ADDRS pins 41b, to allow writing of the cell array 24 in a per se known manner.

The tester 40 generates a random starting address, fed to the address counter 12 through the ADDRS pins 41b, 21b and latches the starting address for Burst mode reading using the ALE pins 41a, 21a. The test mode control unit 30 then replaces the external clock RD needed for synchronous reading by the internal clock CK, generating suitable values for the test mode signal TM, and controls the data multiplexer 36 to feed the buffers 38 with signature Q, instead of the read data D, generating suitable values for the signature output signal TMP. The test mode control unit 30 may also select the reading frequency, sending suitable signals to the oscillator 11.

Once the internal burst operation starts, the address counter 12 increments the addresses automatically, synchronized by the internal clock CK through burst timing control block 22 until the whole cell array 24 is scanned; then, the address counter 12 generates a last carry signal (not shown in FIG. 3) sent to the test mode control unit 30, which ends testing, by switching test mode signals TM, TMN.

At each reading, the read data is supplied by the sensing stage 25 to the signature generator 35, which calculates, according to (2), the signature Q(t), formed by a 16 bit code.

At the end of reading, the end signature Q(t) is supplied through the buffers 38 and the I/O pins 21e, 41a, to the comparator 47, which also receives the expected signature from program memory block 48 and may generate a pass/fail signal P/F fed to the error cache memory 49, connected to the required tester standard output hardware for displaying errors.

Since the successive reads are triggered internally by a clock on the circuit, high speed testing can be done. Use of a multiple strobe facility provided by the tester emulates a High Speed Testing.

Figure 4:
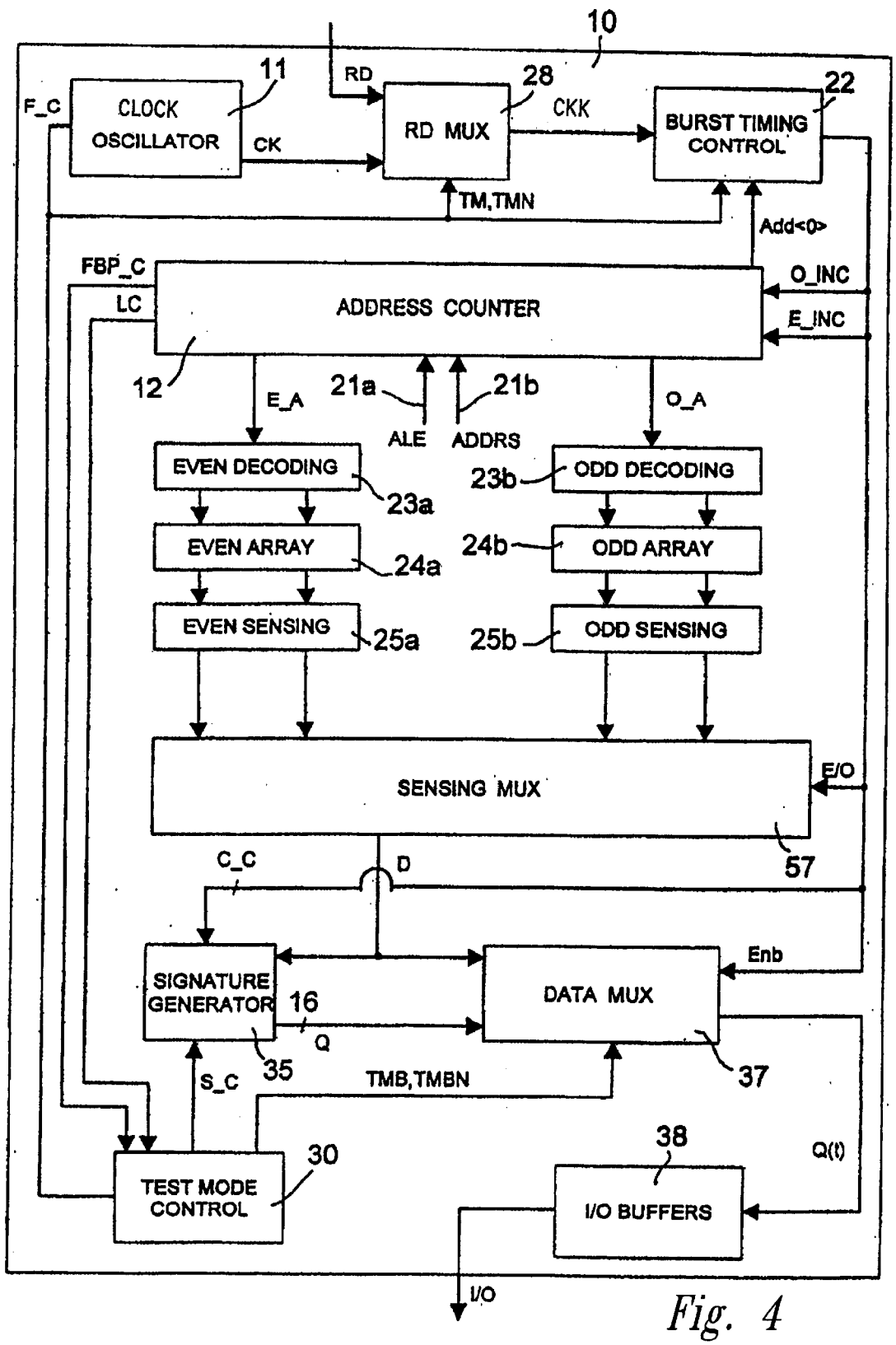
FIG. 4 is more detailed block diagram of the memory device according to the present invention.

FIG. 4 shows a more detailed scheme of the memory device 10, wherein the array 24 is divided in an even array 24a and an odd array 24b, addressed by respective even and odd decoding units 23a, 23b and read through respective even and odd sensing units 25a, 25b.

FIG. 4 points out the connections between the test mode control block 30, the burst timing control block 22 and the various parts of the memory device 10, to set the required test parameters and conditions. The test mode control block 30 thus supplies a frequency control signal F_C to the oscillator 11, for setting the operating frequency thereof; the test mode signals TM, TMN to clock multiplexer 28 and burst timing control block 22 to set them in the test mode configuration; signature output signals TMB, TMBN to the data multiplexer 37 to also set them in the test mode configuration; and a signature control signal S_C (used to change the compression algorithm) to the signature generator 35. Furthermore, the test mode control block 30 receives a feedback polynomial control signal FBP_C (specifically, the present address, from which the signature control signal S_C is calculated) and a last carry signal LC (indicating that the whole matrix has been scanned) from the address counter 12. The test mode control block 30 is accessed and activated by specific commands sent to memory device 10 through ADDRS and I/O pins 21b, 21e by tester 40, in a per se know manner.

The burst timing control block 22 has the purpose of managing the matrix reading and generating the necessary control signals. Therefore, the burst timing control block 22, when activated by the test mode signals TM, TMN, generates increment control signals E_INC and O_INC fed to the address counter 12 for alternately incrementing the addresses of the even and odd array halves 24a, 24b; a sensing control signal E/O fed to a sensing multiplex 57 for connecting the just read array half 24a or 24b to the signature generator 35 and to data multiplexer 37; an enable signal Enb for the data multiplexer 37; and local clock signals C_C derived from the increment control signals O_INC, E_INC for the signature generator 35. As explained with reference to FIG. 3, the burst timing control block 22 is synchronized by timing clock CKK, which is the same clock signal as the internal clock CK when the chip is in test mode.

The address counter 12 receives the starting address and the address latch enable signal from the ADDRS pin 21b and the ALE pin 21a and, controlled by the increment control signals O_INC, E_INC, generates even addresses E_A or odd addresses O_A for respective even and odd decoding units 23a, 23b. The address counter 12 further generates the feedback polynomial control signal FBP_C and the last carry signal LC for the test mode control block 30.

During test mode, the test mode control block 30 receives the feedback polynomial control signal FBP_C (correlated to the present address) and generates therefrom the signature control signal S_C (thus, S_C=f(FBP_C)) which is thus dynamically modified during matrix reading. Since the signature is generated by modifying the feedback polynomial during linear burst, the end signature has a very high robustness against error masking.

Furthermore, in the alternative, matrix reading may be carried out twice or a number of times, and, at each scanning, the test mode control block 30 may generate different signature control signals S_C using each time a different function f(FBP_C), so as to obtain different signatures, thus considerably reducing the risk of error masking. For example, S_C may be a preset bit of the present address FBP_C and in subsequent readings, different address bits may be used.

Figure 5:
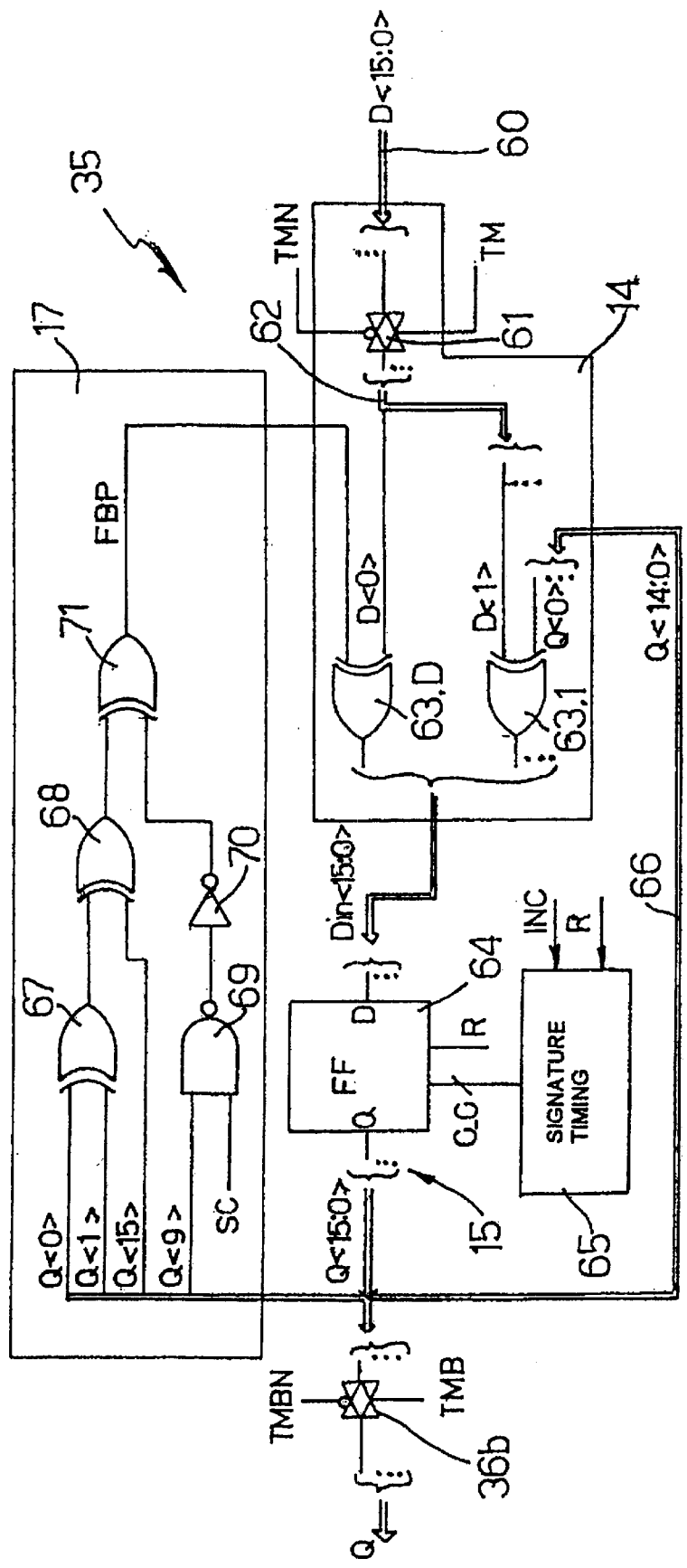
FIG. 5 shows a circuit implementation of a part of the memory device of FIG. 2.

An embodiment of the signature generator 35 using linear feedback shift registers is shown in FIG. 5, which shows the implementation of an inverse filter circuit performing the function $$f(R)=R/(1+D+D^2+D^{16})$$

or the function $$f(R)=R/(1+D+D^2+D^{10}+D^{16})$$

wherein R is here the read data D (memory response fed by the sensing multiplexer 57) and $D^i$ is the i-th bit of the read data D, depending upon the value of the signature control signal S_C, which may be a fixed value or a preset bit of the address of the present data D, as above explained.

FIG. 5 shows in detail the structure of XOR/ADDER block 14, feedback control block 17 and master/slave unit 15. XOR/ADDER block 14 comprises an input bus 60, receiving the sixteen-bit data D (indicated as D<15:0>) from the sensing multiplexer 57 (FIG. 4) and connected to a plurality of pass gates 61 (only one shown). The pass gates 61 (one for each bit of the read data D) receive each a respective bit and are controlled by the test mode signals TM, TMN to supply the read data to a connection bus 62 only during testing.

Figure 7:
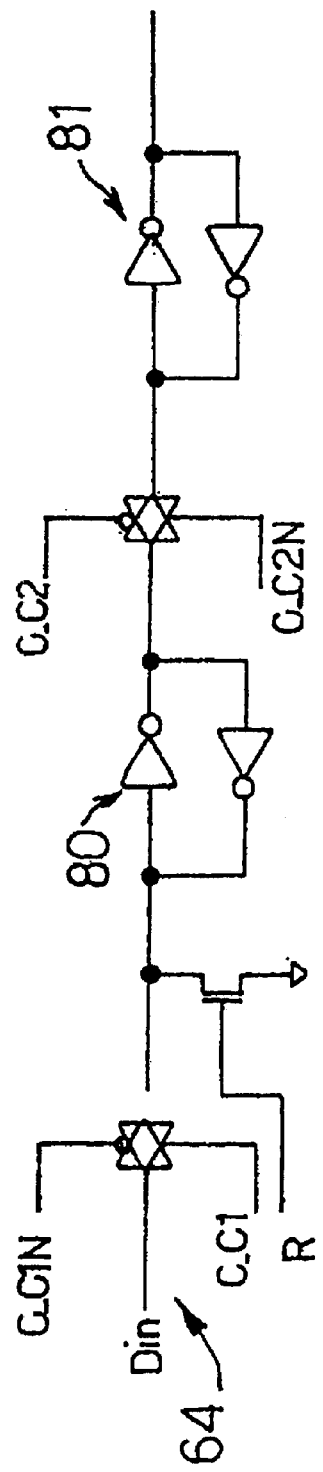

The connection bus 62 is connected to a first input of a plurality of EXOR gates 63.0, 63.1, . . . (only two shown but more may be used as needed). Furthermore, one EXOR gate 63.0 (which receives bit D<0>) has a second input receiving the feedback polynomial value, FBP. The other EXOR gates 63.1, . . . (one for each remaining bit D<15:1> of the read data D present on connection bus 62) receive, at the second input, the previous signature bits Q<14:0> through a signature bus 66. Thus, the EXOR gates 63.0, 63.1, . . . , receive each a respective data bit and one bit from the previous signature Q, except for the first EXOR gate 63.0 that receives FBP at the second input. The outputs of EXOR gates 63 supply a 16-bit new signature data Din<15:0> to be latched which is fed to a plurality of flip/flops 64 (one shown) belonging to the master/slave unit 15. The flip/flops 64 (one for each bit of the new signature data Din) receive each a respective bit of the new signature data Din, as well as the local clock signals C_C and a reset signal R (equal for all flip/flops 64) that is used only during the start of testing for resetting the contents of the master/slave latches forming the flip/flops 64. Substantially, as shown in FIG. 7, the flip/flops 64 are formed by two cascade-connected latches 80, 81 controlled by the local clock signals C_C (in FIG. 7, non overlapping clock signals C_C1, C_C1N, C_C2, C_C2N needed for operating the latches 80, 81 in a master/slave fashion). Flip/flops 64 supply the previous signature Q stored in latch 81 to the EXOR gates 63.1, . . . , and receive the new signature data Din in latch 80 in an non-overlapping time domain synchronized with an increment clock INC fed to signature timing block 65 and given by the sum of the increment control signals E_INC and O_INC.

Figure 6:
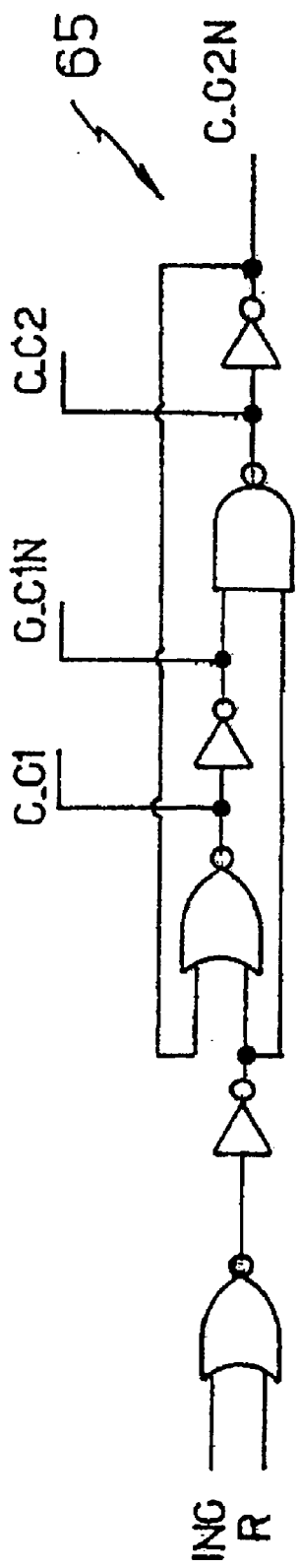
FIGS. 6 and 7 show the implementation of some parts of FIG. 5.

As shown in FIG. 6, the local clock signals C_C are generated by a signature timing block 65 comprised in the burst timing control block 22 (FIG. 4). Local clock signals C_C are generated from the reset signal R and the increment clock INC.

The feedback control block 17 comprises a combinatory circuit using some bits of the signature Q and the signature control signal S_C to generate the feedback polynomial value FBP. In detail, the feedback control block 17 comprises a first EXOR gate 67 having two inputs receiving two bits of the signature Q (e.g., the first and second bits Q<0>, Q<1>) and an output connected to an input of a second EXOR gate 68, a second input whereof receives a further bit of the signature Q (e.g., the last bit Q<15>). A NAND gate 69 has two inputs receiving a further bit of the signature Q (e.g., the tenth bit Q<9>) and the signature control signal S_C (as said, e.g., a preset bit of the present address), and an output connected to an inverter 70. The output of the inverter 70 is connected to an input of a third EXOR gate 71, a second input whereof is connected to the output of the second EXOR gate 68. The output of the third EXOR gate 71 thus generate the feedback polynomial value, FBP.

In the example of FIG. 5, the XOR/ADDER block 14 does not directly receive all the bits of the signature Q, but one less Q<15> that is instead fed indirectly from the feedback control block 17 in form of FBP. Also, the feedback control block 17 does not directly receive the read data D, differently from the general scheme of FIG. 2.

In the signature generator 35, the feedback polynomial value FBP depends each time on some bits of the previous signature Q and the value of the signature control signal S_C (which also influences the function implemented by the feedback control block 17). As a consequence, the signature generator 35 acts as a filter combining each read data D supplied by input bus 60 with the previous signature Q and has an inverse filter response that changes dynamically with memory scanning. Thus, the obtained signature Q is a unique fingerprint for the pattern programmed inside the matrix 13. Furthermore, changing the signature control signal S_C in a predetermined way (so as to depend upon the present address or a combination of the addresses) reduces the chances of having two different pattern with a same signature. Moreover, matrix reading and data compression may be repeated a number of times, each time changing the signature control signal S_C so as to modify the function implemented by the signature generator 35 and to further increase the testing method robustness against error masking.

The memory device 10 may be tested in operative conditions, since the matrix 13 is read at the same speed as during proper operation by use of the internal oscillator 11 producing internal clock signal CK that operates the memory at the same speed it would operate during real time use while in operation by an end customer. Thus any portion of the memory causing errors only at high speed may be detected. Furthermore, faults and criticalities of the memory device 10 may be detected at Wafer Sort Level testing, thus allowing device discrimination and in case rejection before packaging, eliminating useless costs. The tests are carried out on each memory device at the silicon level, such as at the Wafer level, prior to enclosing them in individual packages. The production costs for batches are thus lower.

Finally, it is clear that numerous modifications and variations can be made to the memory and method described and illustrated herein, all of which falling within the scope of the invention, as defined in the attached claims.

In particular, the function used by the signature generator 35 may vary in subsequent matrix scanning and/or during a same matrix scanning. The variability of the functions is obtained using any parameter variable in a predefined way, e.g., depending on the matrix scan such as the address, as above described.

What is claimed is:

1. A nonvolatile memory device composed within a single semiconductor integrated circuit die being a single integrated circuit chip, the nonvolatile memory comprising:
   a memory array including nonvolatile memory cells;
   means for reading data stored in said memory cells;
   a signature code generating stage connected to said memory array and receiving the read data, said signature code generating stage generating a present signature code as a function of said read data and a previous signature code; and
   an internal clock oscillator connected to said means for reading and said signature code generating stage and generating an internal clock.

2. The nonvolatile memory device according to claim 1, further comprising:
   timing control means receiving the internal clock from said internal clock oscillator and generating subsequent increment control signals supplied to said means for reading and signature timing signals supplied to said signature code generating stage.

3. The nonvolatile memory device according to claim 2, wherein said means for reading comprises address counter means generating addresses of memory cells to be read, said timing control means supplying said subsequent increment control signals to said address counter means for uninterrupted addressing of a substantial part of said memory array.

4. The nonvolatile memory device according to claim 3, comprising test mode control means receiving a last carry signal at the end of an entire array scanning and generating a test mode end signal inhibiting said means for reading.

5. The nonvolatile memory device according to claim 1, further comprising:
an input terminal for receiving an external clock;
a clock selecting unit connected to said input terminal and said internal clock oscillator; and
a test mode control unit connected to said clock selecting unit and generating a test mode signal for causing said clock selecting unit to output a selected one of said external and internal clocks.

6. A nonvolatile memory device, comprising:
a memory array including nonvolatile memory cells;
means for reading data stored in said memory cells, data read by the means for reading data being read data;
a signature code generating stage connected to said memory array and receiving the read data, said signature code generating stage generating a present signature code as a function of said read data and a previous signature code;
an internal clock oscillator connected to said means for reading and said signature code generating stage and generating an internal clock, wherein said internal clock oscillator is a multioscillator.

7. A high speed memory test method for a nonvolatile memory composed within a single semiconductor integrated circuit die being a single integrated circuit chip, the method comprising the steps of:
reading data stored in memory cells belonging to a nonvolatile memory array;
generating a present signature code as a function of read data and a previous signature code; and
internally generating a clock signal that is provided to the memory array to clock control lines to read data stored in additional memory cells.

8. The method according to claim 7, further including:
internally generating subsequent increment control signals from said clock signal.

9. The method according to claim 8, further including:
uninterrupted addressing of at least a substantial part of said memory array.

10. The method according to claim 7, further including:
generating a last carry signal at the end of an entire array scanning and generating a test mode signal causing ending of said steps of reading data and generating a present signature code.

11. The method according to claim 8, further including:
receiving an external clock; and
generating a test mode signal for selecting one of said external clock and internal clock.

12. The method according to claim 8, further including:
selecting an operative frequency of said clock signal from among a plurality of operative frequencies.

13. The method according to claim 8, further including:
reading data comprises reading the memory cells in a linear sequence.

14. A memory device composed within a single semiconductor integrated circuit die being a single integrated circuit chip, the memory device comprising:

a memory array including a plurality of memory cells;
a data output stage coupled to the memory array and adapted to receive an output of data stored in the memory array;
a signature code generating circuit connected to the circuit for reading data from the memory array; and
an internal clock oscillator connected to said data output stage and to said signature code generating circuit and adapted to generate an internal clock at an internal clock rate for controlling data read out of the memory array based on the internal clock rate.

15. The circuit according to claim 14, further including:
a test mode control circuit for placing the memory device in a test mode, the test mode control circuit including an output signal line for causing the internal clock to operate during the test mode.

16. The circuit according to claim 14, wherein the signature code generating circuit generates a signature code on each clock cycle, the signature code being a function of data which is read out of the memory array and a previous signature code.

17. The circuit according to claim 14, further including:
a clock multiplexer circuit coupled to the internal clock and coupled to an external clock terminal so as to selectively provide the internal clock or an external clock as an output from the clock multiplexer circuit and an input to the memory array.

18. The memory device according to claim 16, further including:
silicon and a plurality of terminals positioned for access directly to the silicon, prior to the memory device encapsulated in a package; and
an interface circuit coupled to the terminals so as to permit interface with a testing device directly to the memory device.

19. The memory device according to claim 14, wherein the signature code generating circuit includes:
a plurality of exclusive or logic circuits, at least one of the exclusive or logic circuits receiving data from the memory array as one of its input and receiving as another input a signal whose value is based on the previous signature code.

20. Solely for the operations of storage and retrieval of information and for verifying the operations by detachable connection to a tester, a nonvolatile memory device comprising:
a memory array including nonvolatile memory cells;
means for reading data stored in said memory cells, data read by the means for reading data being read data;
a signature code generating stage connected to said memory array and receiving the read data, said signature code generating stage generating a present signature code as a function of said read data and a previous signature code; and
an internal clock oscillator connected to said means for reading and said signature code generating stage and generating an internal clock.

21. A high speed test method to be implemented by a nonvolatile memory, the memory solely for the operations of storage and retrieval of information and for verifying the operations by detachable connection to a tester, the high speed test method comprising the steps of:
reading data stored in memory cells belonging to a nonvolatile memory array;
generating a present signature code as a function of read data and a previous signature code; and internally generating within the nonvolatile memory a clock signal that is provided to the memory array to clock control lines to read data stored in additional memory cells.

22. Solely for the operations of storage and retrieval of information and for verifying the operations by detachable connection to a tester, a memory device comprising:

a memory array including a plurality of memory cells;

a data output stage coupled to the memory array and adapted to receive an output of data stored in the memory array;

a signature code generating circuit connected to the circuit for reading data from the memory array; and an internal clock oscillator connected to said data output stage and to said signature code generating circuit and adapted to generate an internal clock at an internal clock rate for controlling data read out of the memory array based on the internal clock rate.

23. A nonvolatile memory device, comprising:

a memory array including nonvolatile memory cells;

means for reading data stored in said memory cells, data read by the means for reading data being read data;

a signature code generating stage connected to said memory array and receiving the read data, said signature code generating stage generating a present signature code as a function of said read data and a previous signature code;

an internal clock oscillator connected to said means for reading and said signature code generating stage and generating an internal clock and timing control means receiving the internal clock from said internal clock oscillator and generating subsequent increment control signals supplied to said means for reading and signature timing signals supplied to said signature code generating stage.

24. A nonvolatile memory device, comprising:

a memory array including nonvolatile memory cells;

means for reading data stored in said memory cells, data read by the means for reading data being read data;

a signature code generating stage connected to said memory array and receiving the read data, said signature code generating stage generating a present signature code as a function of said read data and a previous signature code;

an internal clock oscillator connected to said means for reading and said signature code generating stage and generating an internal clock;

an input terminal for receiving an external clock;

a clock selecting unit connected to said input terminal and said internal clock oscillator; and a test mode control unit connected to said clock selecting unit and generating a test mode signal for causing said clock selecting unit to output a selected one of said external and internal clocks.

25. A high speed memory test method for a nonvolatile memory, comprising the steps of:

reading data stored in memory cells belonging to a nonvolatile memory array;

generating a present signature code as a function of read data and a previous signature code;

internally generating a clock signal that is provided to the memory array to clock control lines to read data stored in additional memory cells;

internally generating subsequent increment control signals from said clock signal; and internally generating subsequent increment control signals from said clock signal.

26. A high speed memory test method for a nonvolatile memory, comprising the steps of:

reading data stored in memory cells belonging to a nonvolatile memory array;

generating a present signature code as a function of read data and a previous signature code;

internally generating a clock signal that is provided to the memory array to clock control lines to read data stored in additional memory cells; and generating a last carry signal at the end of an entire array scanning and generating a test mode signal causing ending of said steps of reading data and generating a present signature code.

27. A memory device comprising:

a memory array including a plurality of memory cells;

a data output stage coupled to the memory array and adapted to receive an output of data stored in the memory array;

a signature code generating circuit connected to the circuit for reading data from the memory array;

an internal clock oscillator connected to said data output stage and to said signature code generating circuit and adapted to generate an internal clock at an internal clock rate for controlling data read out of the memory array based on the internal clock rate; and a clock multiplexer circuit coupled to the internal clock and coupled to an external clock terminal so as to selectively provide the internal clock or an external clock as an output from the clock multiplexer circuit and an input to the memory array.

* * * * *